US010698202B2

(12) United States Patent
Kimmel et al.

(10) Patent No.: US 10,698,202 B2
(45) Date of Patent: Jun. 30, 2020

(54) COMPOUND DIFFRACTION GRATING AND METHOD OF MANUFACTURE

(71) Applicant: Magic Leap, Inc., Plantation, FL (US)

(72) Inventors: Jyrki Kimmel, Tampere (FI); Jan Eskolin, Pirkkala (FI); Toni Jarvenpaa, Akaa (FI); Jari Turunen, Onttola (FI); Jyrki Saarinen, Joensuu (FI); Seppo Honkanen, Joensuu (FI)

(73) Assignee: Magic Leap, Inc., Plantation, FL (US)

( * ) Notice: Subject to any disclaimer, the term of this patent is extended or adjusted under 35 U.S.C. 154(b) by 187 days.

(21) Appl. No.: 15/564,517

(22) PCT Filed: Mar. 21, 2016

(86) PCT No.: PCT/FI2016/050172
§ 371 (c)(1),
(2) Date: Oct. 5, 2017

(87) PCT Pub. No.: WO2016/162593
PCT Pub. Date: Oct. 13, 2016

(65) Prior Publication Data
US 2018/0081170 A1  Mar. 22, 2018

(30) Foreign Application Priority Data
Apr. 7, 2015  (EP) .................................... 15162521

(51) Int. Cl.
*G02B 5/18* (2006.01)
*G02B 27/00* (2006.01)
(Continued)

(52) U.S. Cl.
CPC .... *G02B 27/0081* (2013.01); *B29D 11/00769* (2013.01); *G02B 5/1847* (2013.01);
(Continued)

(58) Field of Classification Search
CPC  G02B 5/18; G02B 2005/1804; G02B 5/1847; G02B 5/1857; G02B 5/1866;
(Continued)

(56) References Cited

U.S. PATENT DOCUMENTS 8,120,851 B2 * 2/2012 Iwasa ...................... G02B 1/04
359/569
9,086,537 B2 * 7/2015 Iwasa ................... G02B 5/1852
(Continued)

FOREIGN PATENT DOCUMENTS

WO  WO-2009/011172 A1  1/2009

OTHER PUBLICATIONS

Summons to attend oral proceedings pursuant to Rule 115(1) EPC, European Patent Application No. 15162521.7, (7 pages). Jul. 15, 2019.

*Primary Examiner* — Arnel C Lavarias
(74) *Attorney, Agent, or Firm* — Stephen M. De Klerk

(57) ABSTRACT

A method including forming a substrate to form a template which includes areas of high relief and areas of low relief; and forming a high refractive index diffraction grating in the template by adding high refractive index material to the template to form a continuous low relief surface. The high refractive index material fills the areas of low relief and covers the areas of high relief of the template to form a high refractive index diffraction grating. The high refractive index diffraction grating includes the high refractive index material configured to have a low relief side corresponding to the continuous low relief surface and configured by the template to have a periodic side including areas of high relief and areas of low relief which periodically alternate in the first direction with the first periodicity and are interconnected by the high refractive index material.

9 Claims, 3 Drawing Sheets

(51) Int. Cl.
*G03F 7/00* (2006.01)
*B29D 11/00* (2006.01)
*F21V 8/00* (2006.01)

(52) U.S. Cl.
CPC ......... *G02B 5/1857* (2013.01); *G02B 5/1866* (2013.01); *G02B 6/0016* (2013.01); *G02B 6/0038* (2013.01); *G03F 7/0002* (2013.01); *G03F 7/0005* (2013.01); *G02B 2005/1804* (2013.01)

(58) Field of Classification Search
CPC .. G02B 5/1871; G02B 27/01; G02B 27/0101; G02B 27/017; G02B 27/0172; G02B 27/42; G02B 27/4205; G02B 27/44; G03F 7/0002; G03F 7/0005; B29D 11/00769
USPC ....... 359/558, 566, 569, 570, 571, 573, 574, 359/575, 576; 264/1.1, 1.7, 2.5
See application file for complete search history.

(56) References Cited

U.S. PATENT DOCUMENTS

| | | | |
|---|---|---|---|
| 2003/0219992 A1 | 11/2003 | Schaper | 438/748 |
| 2007/0279745 A1 | 12/2007 | Klemann | 359/566 |
| 2008/0043334 A1* | 2/2008 | Itzkovitch | G02B 5/1814 |
| | | | 359/569 |
| 2010/0244168 A1 | 9/2010 | Shiozawa et al. | |
| 2013/0077170 A1 | 3/2013 | Ukuda | |

* cited by examiner

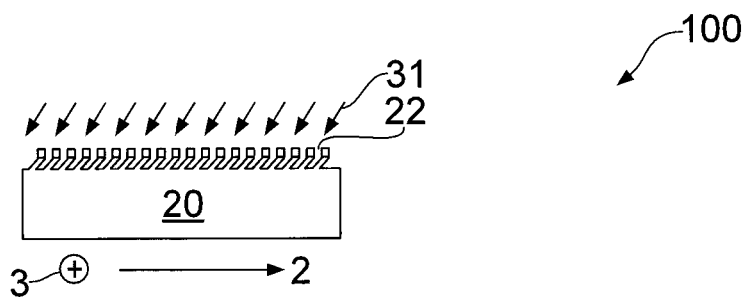
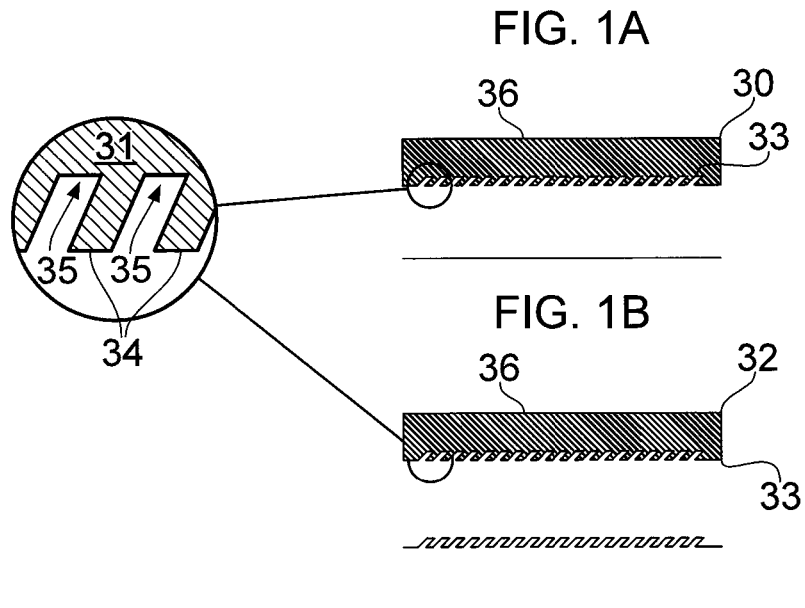
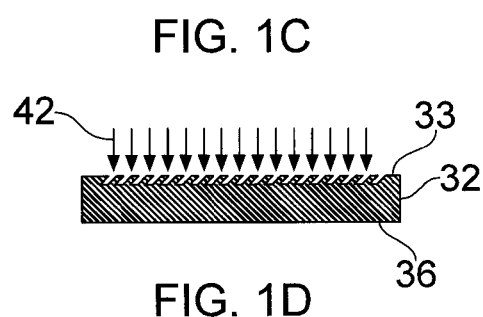
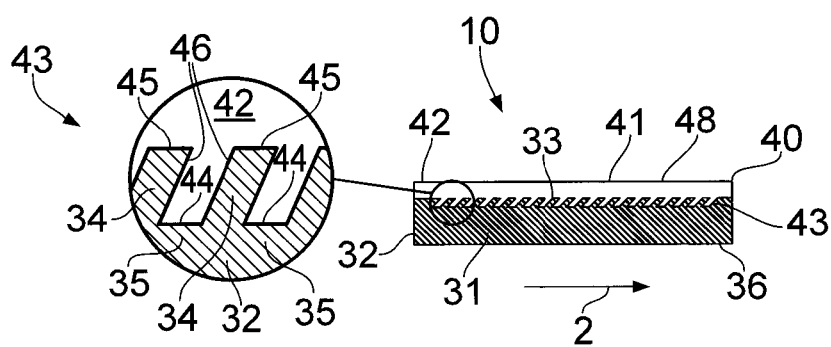
FIG. 1A
FIG. 1B
FIG. 1C
FIG. 1D
FIG. 1E

COMPOUND DIFFRACTION GRATING AND METHOD OF MANUFACTURE

TECHNOLOGICAL FIELD

Embodiments of the present invention relate to a diffraction grating and method of manufacture. In particular, they relate to a high refractive index diffraction grating and method of manufacture.

BACKGROUND

Transmissive diffraction gratings use interference of wave fronts from a periodic structure to obtain diffraction effects.

A high refractive index diffraction grating has an interface between high refractive index material and low refractive index material that increases total internal reflection which can increase efficiency.

There is therefore a need for high refractive index diffraction gratings.

BRIEF SUMMARY

According to various, but not necessarily all, embodiments of the invention there is provided examples as claimed in the appended claims.

BRIEF DESCRIPTION

For a better understanding of various examples that are useful for understanding the brief description, reference will now be made by way of example only to the accompanying drawings in which:

FIGS. 1A to 1E illustrate an example of a method for manufacturing, in high volumes, a high refractive index diffraction grating;

DETAILED DESCRIPTION

Figure 2A:
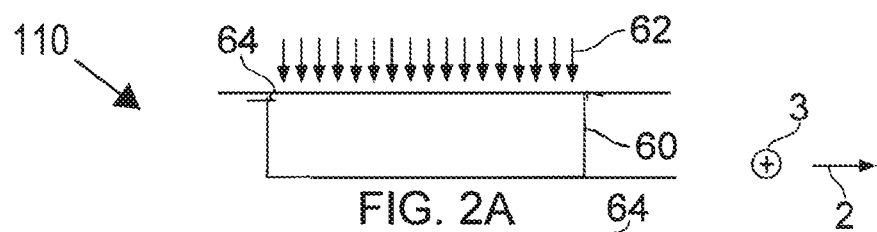
FIGS. 2A to 2C illustrate a method for forming a master mold.

The examples described below enable the manufacture in large quantities of very high quality, high efficiency, high refractive index diffraction gratings, which has not previously been possible.

FIGS. 1A to 1E illustrate an example of a method 100 for manufacturing, in high volumes, a high refractive index diffraction grating 40.

In this document, the term 'high' in relation to a refractive index means a refractive index greater than 1.70.

In this document, the term 'low' in relation to a refractive index means a refractive index less than 1.55.

The choice of particular high refractive index materials and low refractive index materials may depend on application. The refractive index difference between the high refractive index material and the low refractive index material may, for example, be controlled to achieved a desired efficiency at a desired diffraction order.

FIG. 1A illustrates deposition of material 31 in a master mold 20 to form a substrate 30. Material 31 is deposited to overfill parallel channels 22 of the master mold 20 that repeat in a first direction 2 with a first periodicity. The parallel channels 22 extend, in parallel, in a second direction 3 orthogonal to the first direction 2. At FIG. 1B, the substrate 30 has been formed in the master mold 20.

Where the material 31 contacts the side of the mold 20 that defines the channels 22 of the mold, a periodic side 33 of the substrate 30 is formed. The periodic side 33 comprises interconnected areas of high relief 34 (formed in the channels 22) and areas of low relief 35 (formed outside the channels 22). The areas of high relief 34 and the areas of low relief 35 periodically alternate in the first direction 2 with the first periodicity. The areas of high relief 34 and the areas of low relief extend, in parallel, in the second direction 3 orthogonal to the first direction 2.

The side 36 of the substrate 30 opposite the periodic side 33 has low relief. That is there is little or no modulation in relief from a base level over distances corresponding to the first periodicity.

The side 36 may, for example, be a planar surface. The planar surface may be flat or curved and the base level will then be respectively flat or curved.

The substrate 30 is continuous. It extends without interruption in the first direction 2 and the second direction 3 and the areas of high relief 34 and areas of low relief 35 are interconnected without gaps.

At FIG. 1C the substrate 30 is removed from the master mold 20 to form a template 32 for forming the high refractive index diffraction grating 40.

The periodic side 33 comprises areas of high relief 34 and areas of low relief 35 that periodically alternate in the first direction 2 with the first periodicity. The areas of low relief 35 of the template 32 will form corresponding areas of high relief 44 of the high refractive index diffraction grating 40. The areas of high relief 34 of the template will form corresponding areas of low relief 45 of the high refractive index diffraction grating 40.

At FIG. 1D the high refractive index diffraction grating 40 is formed in the template 32 by adding high refractive index material 42 to the template 32.

As shown in FIG. 1E, the high refractive index material 42 is added to the template 32 to over-fill the channels in the template 32 and forms a continuous low relief surface 41. That is there is little or no variation in relief relative to a base level over distances corresponding to the first periodicity. The low relief surface 41 may, for example, be a planar surface in which case the base level is planar. The planar surface may be flat or curved and the base level will then be flat or curved. The low relief surface 41 extends without interruption (gaps) in the first direction 2 and the second direction 3.

The high refractive index material 42 fills the areas of low relief 35 of the template 32 and covers the areas of high relief 34 of the template 32 to form a high refractive index diffraction grating 40 in the template 32.

The high refractive index diffraction grating 40 therefore comprises high refractive index material 42 that is configured to have a low relief side 48 corresponding to the continuous low relief surface 41 and configured by the template 32 to have a periodic side 43 comprising areas of high relief 44 and areas of low relief 45.

The areas of high relief 44 and the areas of low relief 45 of the high refractive index material 42 periodically alternate in the first direction 2 with the first periodicity and are interconnected 46 by the high refractive index material 42 without gaps.

The areas of high relief 44 and the areas of low relief 45 extend, in parallel, in the second direction 3 orthogonal to the first direction 2.

The high refractive index diffraction grating 40 is therefore a block of solid material with a periodic side 43 comprising areas of high relief 44 and areas of low relief 45 that alternate periodically in the first direction 2 and extend in parallel in the second direction 3.

In this example, the only discontinuities in the block of solid high refractive index material 42 are surface discontinuities at the periodic side 43 where the surface is discontinuous because its relief periodically changes sharply, in this example, to form the high refractive index diffraction grating 40.

Referring back to FIG. 1D, the high refractive index material 42 may be added to the template 32 using atomic layer deposition (ALD). Atomic layer deposition (ALD) is a thin film deposition technique that uses gas phase chemical processes sequentially and repetitively to slowly deposit material.

Referring back to FIG. 1D, the high refractive index material 42 may be titanium dioxide. This may be deposited, for example, using atomic layer deposition. Other high refractive index materials may also be used, such as $SrTiO_3$, $LiNbO_3$, $BaTiO_3$, $Y_2O_3$, MgO, $Al_2O_3$, $Si_3N_4$, $SIO_2$, TiN and VN Referring back to FIG. 1A, the substrate 30 may, for example, be formed using injection compression molding. Molding material 31, generally preheated, may placed in an open, heated mold 20. The mold 30 is closed and pressure is applied to force the molding material 31 into contact with the mold 20 until the molding material 31 has cured.

Referring back to FIG. 1A, the material 31 may, for example, comprise a polymer such as for example a polycarbonate or soluble polymer. Other polymers applicable for this method include but are not restricted to polyethylene napthalate (PEN), polyethylene terephthalate (PET), poly (methyl methacrylate) (PMMA), polyactide (PLA), nylon, etc.

In some examples, but not necessarily all examples, the template 32 may be retained in the finished product and in these examples, the material 31 forming the template 32 may be a low refractive index material. The apparatus 10 formed at FIG. 1E then comprises: a low refractive index diffraction grating comprising low refractive index material 31 configured to have a low relief side 36 and a periodic side 33, wherein the periodic side 33 of the low refractive index material 31 is continuous comprising areas of high relief 34 and areas of low relief 35 that periodically alternate in the first direction 2 with the first periodicity; and a high refractive index diffraction grating 40 in contact with the low refractive index diffraction grating, wherein the high refractive index diffraction grating 40 comprises high refractive index material 42 configured to have a low relief side 48 and a periodic side 43 comprising areas of high relief 44 and areas of low relief 45, wherein the areas of high relief 44 and the areas of low relief 45 of the high refractive index material 42 periodically alternate in the first direction 2 with the first periodicity and are interconnected 46 by the high refractive index material 42.

The areas of high relief 44 of the high refractive index diffraction grating 40 contact areas of low relief 35 of the low refractive index diffraction grating and areas of low relief 45 of the high refractive index diffraction grating 40 contact areas of high relief 34 of the low refractive index diffraction grating.

Where the apparatus 10 illustrated in FIG. 1E is a final product, the low relief side 48 of the high refractive index material 42 defines a first exterior surface of the apparatus 10 and the low relief side 36 of the low refractive index material 32 defines a second exterior surface of the apparatus 10 opposite the first exterior surface.

Figure 3:
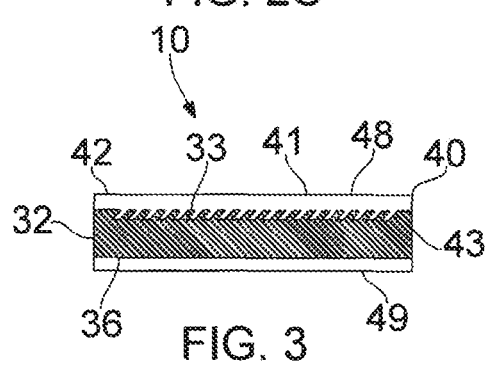
FIG. 3 illustrates an example of an apparatus with a low-refractive index template between a high refractive index diffraction grating and the high refractive index material.

FIG. 3 illustrates an example of how the apparatus 10 may be augmented. A layer 49 of high refractive index material 42 is formed on the low relief side 36 of the template 32 that opposes the periodic side 33 of the template 32. The template 32 is formed from low-refractive index material and the layer 49 of high refractive index material 42 formed on the low relief side 36 of the template 32 enhances total internal reflection of light within the template 32. The apparatus 10 illustrated in FIG. 3 may be a final product.

Figure 2B:
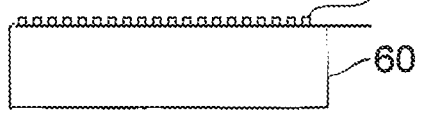
Figure 2C:

FIGS. 2A to 2C illustrate a method 110 for forming a master mold 20.

As illustrated in FIG. 2A, a resist layer 64 is formed over a substrate 60. The resist layer 64 may be selectively patterned 62 and selectively removed to form a patterned resist 64 as illustrated in FIG. 2B. In this example, the patterned resist comprises stripes of resist material that are evenly separated in the first direction 2 and extend, in parallel, in the second direction 3. The resist 64 may be a lithographically patterned photoresist layer or a layer of resist (for example, Cr) patterned using a lithographically patterned photoresist layer.

As illustrated in FIG. 2C, material is etched 66 from the substrate 60 using the patterned resist 64 as a mask. The etching creates the master mask 20 that has channels 22. The channels 22 are evenly spaced in the first direction 2 with the first periodicity and the channels run parallel to each other in the second direction 3.

The patterning of the resist 64 may, for example, be achieved using e-beam or optical lithography.

The selective removal of the substrate 60 to form the mold 20 may be achieved using, for example, reactive ion-beam etching.

Although a particular cross-sectional profile has been illustrated, it should be appreciated that many other profiles may be used to make mold 20 used to manufacture high refractive index diffraction gratings 40 having different profiles.

In this example, the channels 22 are slanted. The side walls of the channels 22 form an acute angle with a top surface of the master mold 20. In other examples, the channels 22 form a 90 degree angle with a top surface of the master mold 20.

In this example, the side walls of the channels 22 are parallel and each of the channels has a base that forms one of the areas of low relief 45. In other examples, the sidewalls of a channel may not be parallel and they may meet at an edge to define of area of low relief 45.

The profile of the master mold 20 is formed in negative image in the template 32 and in positive image in the high refractive index diffraction grating 40

For example, the master mold 20 and the high refractive index diffraction grating 40 may both have alternative periodic profiles such as binary, sinusoidal, step-function or blazed. Some of these profiles are discontinuous with four sharp transitions per period (binary, step-function), some are discontinuous with two sharp transitions per period (blazed) and some are continuous with no sharp transitions per period (sinusoidal, arbitrary periodic, continuously changing relief profiles) FIG. 4 illustrates a further process that may be applied to the apparatus 10 illustrated in FIG. 1E.

A substrate 50 is added to the low relief side 48 of the high refractive index diffraction grating 40. The substrate 50 may be a substrate 50 of high refractive index glass and it may be attached to the low relief side 48 of the high refractive index diffraction grating 40 using optically clear adhesive.

Figure 4:
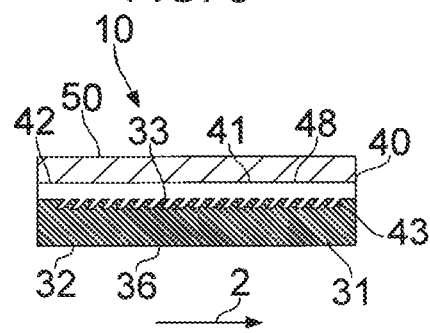
FIG. 4 illustrates an apparatus with an attached substrate.

The apparatus 10 illustrated in FIG. 4 may be a final product.

In some examples, but not necessarily all examples, the template 32 may be retained in the final product and in these examples, the material 31 forming the template 32 may be a low refractive index material 31. The apparatus 10 formed at FIG. 4 then comprises: a low refractive index diffraction grating; and a high refractive index diffraction grating 40 in contact with the low refractive index diffraction grating.

As previously described and as shown in FIG. 1E, the low refractive index diffraction grating comprises low refractive index material 31 configured to have a low relief side 36 and a periodic side 33. The periodic side 33 of the low refractive index material 31 is continuous comprising areas of high relief 34 and areas of low relief 35 that periodically alternate in the first direction 2 with the first periodicity.

As previously described and as shown in FIG. 1E, the high refractive index diffraction grating 40 comprises high refractive index material 42 configured to have a low relief side 48 and a periodic side 43 comprising areas of high relief 44 and areas of low relief 45. The areas of high relief 44 and the areas of low relief 45 of the high refractive index material 42 periodically alternate in the first direction 2 with the first periodicity and are interconnected 46 by the high refractive index material 42.

The areas of high relief 44 of the high refractive index diffraction grating 40 contact areas of low relief 35 of the low refractive index diffraction grating and areas of low relief 45 of the high refractive index diffraction grating 40 contact areas of high relief 34 of the low refractive index diffraction grating.

Where the apparatus 10 is a final product, the low relief side 36 of the low refractive index material 31 defines a first exterior surface of the apparatus 10 and the substrate 50 defines a second exterior surface of the apparatus 10 opposite the first exterior surface.

Figure 5:
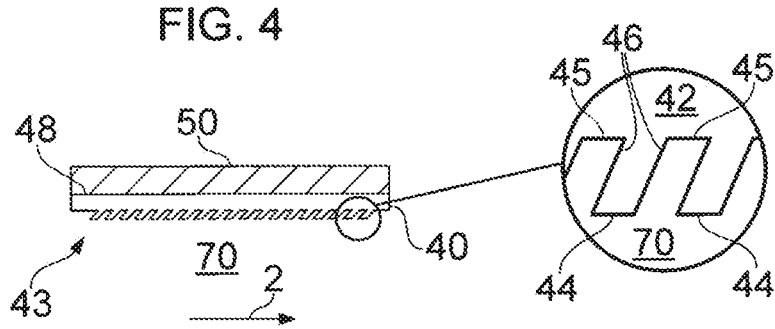
FIG. 5 illustrates an apparatus with the template removed.

FIG. 5 illustrates a further process that may be applied to the apparatus 10 illustrated in FIG. 4.

The apparatus 10 as illustrated in FIG. 4, may be modified by removing the template 32 from the apparatus 10 leaving the combination of high refractive index diffraction grating 40 and substrate 50, as illustrated in FIG. 5. The template 32 is not retained but is sacrificial and is absent exposing the periodic side 43 of the high index diffraction grating 40 to a low refractive index atmosphere 70 such as the ambient air.

As the template 32 is not retained, it need not be a low refractive index template.

The apparatus 10 illustrated in FIG. 5 may be a final product.

The apparatus 10 formed at FIG. 5 comprises: a high refractive index diffraction grating 40 comprising high refractive index material 42 configured to have a low relief side 48 and a periodic side 43 comprising areas of high relief 44 and areas of low relief 55. The areas of high relief 44 and the areas of low relief 45 of the high refractive index material 42 periodically alternate in the first direction 2 with the first periodicity and are interconnected 46 by the high refractive index material 42. The low relief side 48 of the high refractive index material 42 contacts second high diffraction index material of the substrate 50.

Figure 6:
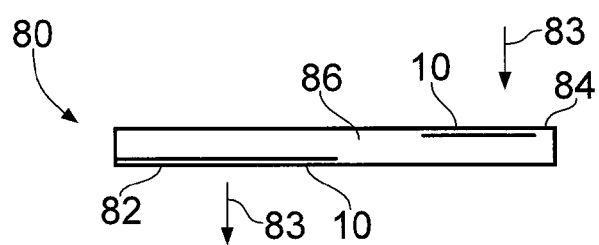
FIG. 6 illustrates an example of the apparatus in use.

FIG. 6 illustrates an example of how any of the apparatus 10 previously described may be used. Other uses are possible. In this example, the high index refractive grating 40 is used as a transmissive diffraction grating. The high refractive index diffraction grating 40 is used as an exit pupil diffraction grating 82 of an exit pupil expander 80 and/or as an entrance pupil diffraction grating 84 of the exit pupil expander 80. The entrance pupil diffraction grating is shorter than the exit pupil and they are interconnected via a light guide 86. Light 83 enters the entrance pupil diffraction grating 84 and then exits the exit pupil diffraction grating 82.

Other uses of the apparatus 10 are where large area, precision diffraction gratings are required, for example, as a backlight grating array for a display.

Figure 7:
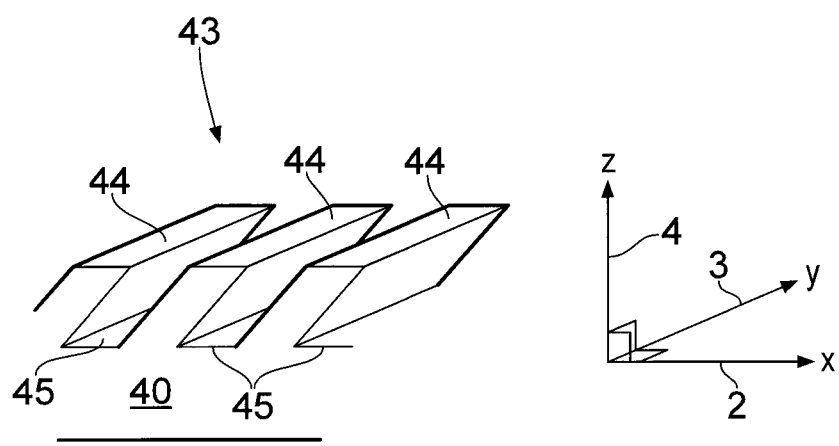
FIG. 7 illustrates perspective view of a high refractive index diffraction grating.

FIG. 7 illustrates in more detail an example of a geometry of one example of a high refractive index diffraction grating 40.

As previously described the cross-section profile of the high refractive index diffraction grating 40, while periodic, may take different forms.

The periodic side 43 of the high refractive index material 42 is periodic only in the first direction 2. It is continuous and has unchanging relief in the second direction 3 orthogonal to first direction 2. The high refractive index material 42 is discontinuous in a third direction 4 orthogonal to the first direction 2 and the second direction 3.

The areas of high relief 44 and areas of low relief 45 extend parallel to the second direction 3 orthogonal to the first direction 2. The areas of low relief 45 form parallel channels.

In this example, but not necessarily all examples, the areas of high relief 44 form planar parallel surfaces and the areas of low relief 45 form planar parallel surfaces. This is not the case for example in a blazed diffraction grating.

In this example, but not necessarily all examples, the areas of high relief 44 form planar parallel surfaces that share a common upper plane and the areas of low relief 45 form planar parallel surfaces that share a common lower plane parallel to the common upper plane. This is not the case for example in a blazed diffraction grating.

In this example, but not necessarily all examples, the interconnecting areas 46 of the high index material between the adjacent areas of high relief 44 and low relief 45 are at a common angle to the first direction 2. This is not the case for example in a blazed diffraction grating.

The term 'periodic' in the first direction 2 means that in the first direction the feature of interest (e.g. high relief area 44 and/or low relief area 45) repeats every distance d, where d is the period.

In this example, but not necessarily all examples, the areas of high relief 44 and the areas of low relief 45 have the same length in the first direction 2. The high refractive index diffraction grating 40 is a binary diffraction grating.

Over relatively long (mm scale) distance, the periodicity and/or the height of the relief may slowly change to allow for modulation of either the period or height of the grating profile.

The blocks illustrated in the Figs may represent steps in a method. The illustration of a particular order to the blocks does not necessarily imply that there is a required or preferred order for the blocks and the order and arrangement of the block may be varied. Furthermore, it may be possible for some blocks to be omitted.

As used here 'module' refers to a unit or apparatus that excludes certain parts/components that would be added by an end manufacturer or a user. The apparatus 10 may be a module.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . ." or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
forming a substrate of a low refractive index material in a master mold;
removing the substrate from the master mold to form a template having a periodic side that is continuous and comprises areas of high relief and areas of low relief that periodically alternate in a first direction with a first periodicity; and
forming a high refractive index diffraction grating in the template by adding high refractive index material to the template to form a continuous low relief surface, the high refractive index material filling the areas of low relief of the template and covering the areas of high relief of the template to form the high refractive index diffraction grating in the template, wherein the high refractive index diffraction grating comprises the high refractive index material configured to have a low relief side corresponding to the continuous low relief surface and configured by the template to have a periodic side comprising areas of high relief and areas of low relief, wherein the areas of high relief and the areas of low relief of the high refractive index material periodically alternate in the first direction with the first periodicity and are interconnected by the high refractive index material, wherein the method comprises forming a high refractive index diffraction grating in the template by adding high refractive index material to the template using atomic layer deposition.

2. A method as claimed in claim 1, comprising forming the high refractive index diffraction grating in the template using titanium dioxide, $SrTiO_3$, $LiNbO_3$, $BaTiO_3$, $Y_2O_3$, MgO, $Al_2O_3$, $Si_3N_4$, $SIO_2$, TiN or VN.

3. A method as claimed in claim 1, wherein the template comprises polymer.

4. A method as claimed in claim 1, comprising forming the template using injection compression molding of the high refractive index material.

5. A method as claimed in claim 1 comprising creating a master mold wherein the master mold has a plurality of parallel channels.

6. A method as claimed in claim 1, comprising adding a substrate to the low relief side of the high refractive index diffraction grating.

7. A method as claimed in claim 6, wherein the substrate comprises high refractive index glass.

8. A method as claimed in claim 1, wherein the low refractive index template is retained in a direct product of the method or wherein the low refractive index template is not retained and is absent from a direct product of the method exposing the periodic side of the high index diffraction grating to a low refractive index atmosphere.

9. A method as claimed in claim 1, comprising forming as a direct product an apparatus comprising:
a low refractive index diffraction grating comprising low refractive index material configured to have a low relief side and a periodic side, wherein the periodic side of the low refractive index material is continuous comprising areas of high relief and areas of low relief that periodically alternate in a first direction with a first periodicity; and
the high refractive index diffraction grating being in contact with the low refractive index diffraction grating,
wherein areas of high relief of the high refractive index diffraction grating contact areas of low relief of the low refractive index diffraction grating and areas of low relief of the high refractive index diffraction grating contact areas of high relief of the low refractive index diffraction grating.

* * * * *